United States Patent [19]

Kawai

[11] Patent Number: 5,264,310
[45] Date of Patent: Nov. 23, 1993

[54] ALIGNMENT MARK HAVING REGIONS FORMED BY ENERGY BEAM IRRADIATION THEREIN AND METHOD OF MANUFACTURING THE SAME

[75] Inventor: Akira Kawai, Hyogo, Japan

[73] Assignee: Mitsubishi Denki Kabushiki Kaisha, Tokyo, Japan

[21] Appl. No.: 757,389

[22] Filed: Sep. 10, 1991

[30] Foreign Application Priority Data

Sep. 12, 1990 [JP] Japan ................ 2-243008

[51] Int. Cl.$^5$ ................................ G03F 9/00
[52] U.S. Cl. ................................ 430/5; 430/4; 430/311
[58] Field of Search ................ 430/5, 4, 311

[56] References Cited

U.S. PATENT DOCUMENTS 4,434,224  2/1984  Yoshikawa ............... 430/5
5,100,834  3/1992  Mukai .................. 437/203

FOREIGN PATENT DOCUMENTS 63-308916  12/1988  Japan.
1-273316   11/1989  Japan.

OTHER PUBLICATIONS

Kuniyoshi et al, "New Evaluation Approach of Alignment Signal from Resist-Coated Patterns", *JJAP Series* 3, pp. 124-129.

*Primary Examiner*—Marion E. McCamish
*Assistant Examiner*—Mark A. Chapman
*Attorney, Agent, or Firm*—Lowe, Price, LeBlanc & Becker

[57] ABSTRACT

Alignment marks capable of providing accurate registration signals even if substrate surface is rough and capable of effectively preventing degradation of registration accuracy due to unevenness of a surface of a resist film, and method of forming such alignment marks are disclosed. The alignment marks include flat portions 1a having high vertical reflectance serving as the alignment mark portions and rough portions 1b, formed spaced apart from each other by a prescribed distance on a surface of a substrate 1 by irradiation of laser beam 50. Therefore, fluctuation of height of a surface of a resist film 13 formed on the alignment marks with an upper layer film posed therebetween can be prevented, and in turn, degradation of registration accuracy of masks due to the unevenness of the resist film surface can be effectively prevented. Even if the surface of the substrate is rough, flat portions 1a providing accurate signal waveforms can be easily formed.

9 Claims, 8 Drawing Sheets

ALIGNMENT MARK HAVING REGIONS FORMED BY ENERGY BEAM IRRADIATION THEREIN AND METHOD OF MANUFACTURING THE SAME

BACKGROUND OF THE INVENTION

1. Field of the Invention

The present invention relates to an alignment marks and a method of forming the same and, more specifically, to alignment marks for registration of masks of respective layers when a number of layers are successively formed on a substrate, and to a method of forming the same.

2. Description of the Background Art

Alignment marks for registration of masks of stacked layers used in forming elements on a semiconductor wafer have been known. FIG. 6 is a schematic diagram showing a full structure of a conventional semiconductor wafer having alignment marks formed thereon. Referring to FIG. 6, a plurality of LSI chips 101 are formed on a semiconductor wafer 100. Regions 102a and 102b for forming alignment marks are provided in the directions of X and Y axes along the LSI chips 101. In the region 102a, an alignment mark for registration in the Y axis direction is formed, while in the region 102b, an alignment mark for registration in the X axis direction is formed.

FIG. 7A is an enlarged plan view of the region 102b for forming the alignment mark, FIG. 7B is a front section taken along the line A—A of the alignment mark forming region shown in FIG. 7A, and FIG. 7C is a waveform showing a signal waveform provided by light diffracted from the conventional alignment mark shown in FIGS. 7A and 7B. Referring to FIG. 7A, alignment marks 1c are formed spaced apart from each other by a prescribed distance, in the longitudinal direction, and a plurality of (5 to 10) columns of marks are arranged. The cross section of the alignment mark forming region 102b of FIG. 7A taken along the line A—A is as shown in FIG. 7B. More specifically, alignment marks 1c of convexes and concaves are formed spaced apart by a prescribed distance on the substrate 1. When He-Ne laser beam 200 having longitudinal range of irradiation is emitted in the direction of the arrow as shown in FIG. 7A, a signal waveform such as shown in FIG. 7C of the light diffracted from the alignment marks 1c of FIG. 7B is provided. Registration of the masks is done based on the signal waveform.

FIGS. 8A to 8C are cross sections showing the steps of manufacturing the conventional alignment marks shown in FIG. 7A and 7B. Referring to FIG. 8A to 8C, the method of manufacturing the conventional alignment marks will be described. First, as shown in FIG. 8A, a resist pattern 21 is formed on a region on a substrate 1 where the alignment marks 1c, which will be described later, are to be formed. By effecting etching using the resist patten 21 as a mask, alignment marks 1c having prescribed height are formed. Then, as shown in FIG. 8C, the resist pattern 21 is removed. The conventional alignment marks 1c are formed in this manner.

FIG. 9A shows ideal forms of an upper layer film and a resist film formed on the alignment marks shown in FIG. 7B. Referring to FIG. 9A, an ideal upper layer film 22 is formed conformably on the substrate 1, and an ideal resist film whose surface height made even is formed on the upper layer film 22. FIG. 9B shows a signal waveform provided by the light diffracted from the alignment marks shown in FIG. 9A. Referring to FIG. 9B, the signal waveform provided by the structure shown in FIG. 9A is similar to that of FIG. 7C. In the actual process of manufacturing, the upper layer film 22 is patterned based on the signal waveform provided with the alignment marks 1C formed on the substrate 1 as a reference, as shown in FIG. 9A. Namely, based on the signal waveform shown in FIG. 9B, the resist film 23 formed on the upper layer film 22 is patterned at first, and the upper layer film 22 is etched by using the patterned resist film 23. Thus, the conventional step of mask registration for forming elements such as LSI chips are done using the concave and convex shaped alignment marks 1c. When elements having a plurality of layers stacked one after another are to be formed, concave and convex shaped alignment marks are formed on respective layers as needed, and mask registration of the layer formed there on is done based on such marks.

As described above, conventionally, registration of masks during manufacturing elements is done by forming concave and convex shaped alignment marks 1c and by using the signal waveforms of the light diffracted from the alignment marks 1c.

However, accurate signal waveforms may not be provided dependent on the surface condition (roughness) of the upper layer film formed on the alignment marks 1c or on the shapes of the resist films formed further thereon. FIG. 10A is a cross section showing the shapes of alignment marks formed on a substrate whose surface is rough, and FIG. 10B shows a signal waveform provided by the light diffracted from the alignment marks shown in FIG. 10A. Referring to FIG. 10A, when a metal film such as Al or W is formed by spattering, the surface of the metal film, which is the substrate 11 on which the alignment marks are to be formed, becomes rough dependent on the conditions of film formation by thermal processing. When the alignment marks 1c are formed in this condition, the surface of the alignment marks 1c becomes rough. Even if a normal insulating film 32 and an ideal resist film 33 having the surface height even are formed on the alignment marks 1c, the signal waveform of the diffracted light provided by the shapes of FIG. 10A will be as shown in FIG. 10B, since minute rough shapes on the surface of the substrate 11 increases diffuse reflection. And it is difficult to accurately registrate masks based on such a waveform as shown in FIG. 10B.

FIG. 11A shows a cross section in which a normal insulating film and an actual resist film are formed on alignment marks the surfaces of which are smooth and flat, and FIG. 11B shows a signal waveform provided by the light diffracted from the alignment marks shown in FIG. 11A. Referring to FIG. 11A, when a normal insulating film 42 or the like is formed without thermal processing after deposition or formed by thermal oxidation on the substrate 1, the surface of the insulating film 42 has almost ideal shape as that of the ideal upper layer film 22 shown in FIG. 9A. However, as to the resist film 43 formed on the normal insulating film 42, it is difficult to provide a symmetrical coverage such as shown in FIG. 9A. Namely, in the actual step of resist application, provision of symmetrical coverage is difficult due to distortion and deviation caused by the concave and convex shapes of the alignment marks 1c, resulting in asymmetrical resist coverage. When such asymmetrical resist 43 is formed, the signal waveform becomes as shown in FIG. 11B, and the peak of the diffraction light is off the center of the mark shown in FIG. 9B. If registration of masks is done by using such a signal waveform of the diffraction light, accurate registration is difficult.

More specifically, in the prior art, when alignment marks 1c are formed on a surface of a metal film which is made rough during spattering or thermal processing, peaks of the waveform of the diffraction light do not appear, making it difficult to accurately carry out registration of masks. Even if normal insulating film having flat surface is formed on alignment marks 1c with flat surfaces, the resist film 43 formed on the normal insulating film 42 has asymmetrical coverage. Therefore, the peaks of the signal waveform of the diffraction light are off the center, and in this case also, accurate registration is difficult.

Namely, in the prior art, it is difficult to effectively prevent degradation of registration accuracy caused by asymmetrical resist coverage, and it is difficult to form alignment marks providing accurate mask registration signals when the substrate surface is rough.

SUMMARY OF THE INVENTION

An object of the present invention is to effectively prevent degradation of registration accuracy caused by asymmetrical coverage of a surface of a resist film formed on alignment marks.

Another object of the present invention is to readily form alignment marks providing accurate mask registration signals, even if substrate surface is rough, in a method of forming alignment marks.

Briefly stated, in accordance with a first aspect of the present invention, alignment marks include flat regions and rough regions formed alternately and spaced apart from each other at a prescribed distance, at least on a surface of a substrate.

In operation, since flat regions and rough regions are formed alternately and spaced apart by a prescribed distance on a substrate surface, height of the resist surface does not fluctuate as in the prior art, when an upper layer film and a resist film are formed on the flat and rough regions.

In accordance with a second aspect of the present invention, a method of forming alignment marks includes the step of forming flat regions with flat surfaces and rough regions with rough surfaces by directing high energy beam at least onto prescribed regions on a substrate surface.

In operation, by directing a high energy beam to at least prescribed regions on a substrate surface, flat regions with flat surfaces and rough regions with rough surfaces are formed. Consequently, if the surface of the substrate is rough, flat regions having high surface reflectance can be readily formed by irradiation of high energy beams.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1A:
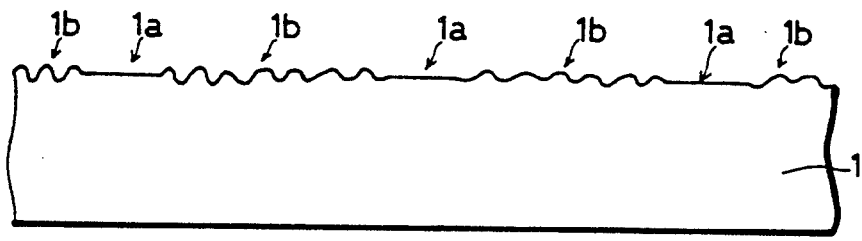
FIG. 1A is a cross sectional view showing alignment marks in accordance with one embodiment of the present invention.
Figure 1B:
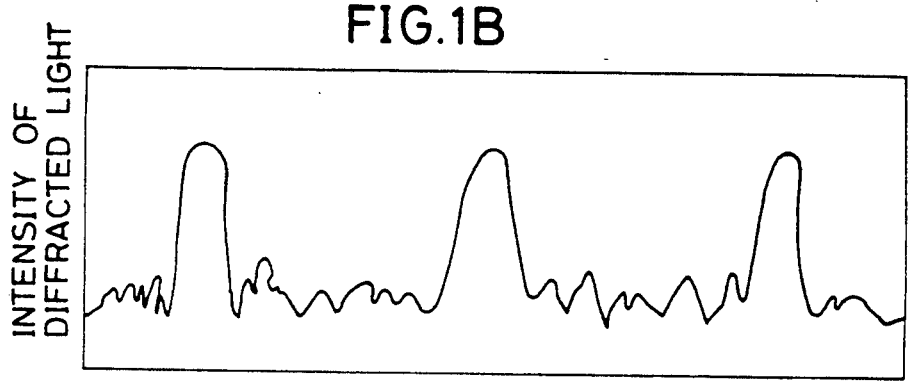
FIG. 1B is a diagram of signal waveform provided by light diffracted from alignment marks shown in FIG. 1A.
Figure 7A:
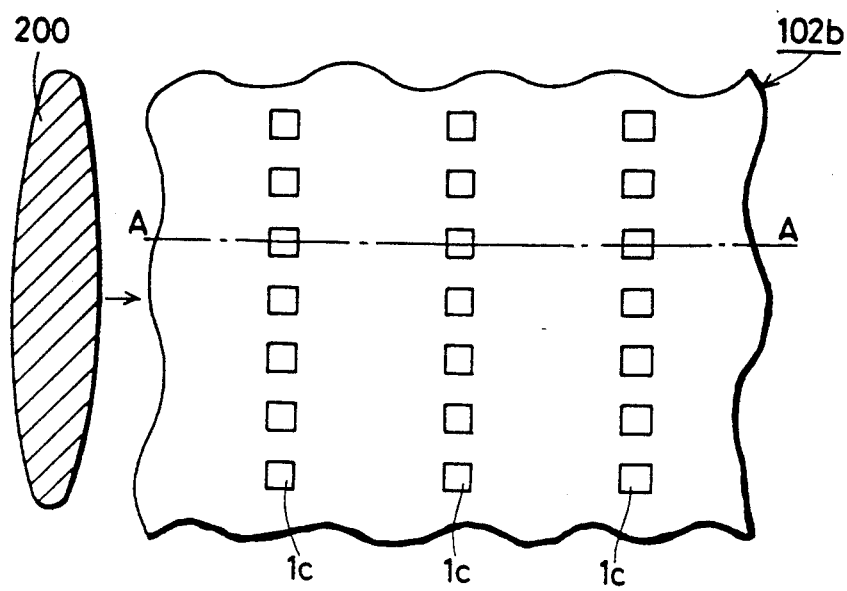
FIG. 7A is a partial enlarged view showing alignment mark forming region shown in FIG. 6.
Figure 7B:
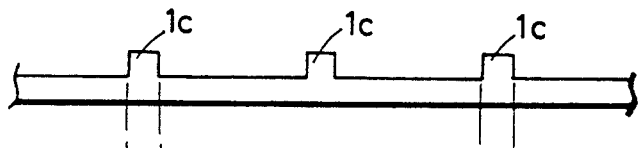
FIG. 7B is a front cross section taken along the line A—A of the alignment mark forming region shown in FIG. 7A.
Figure 7C:
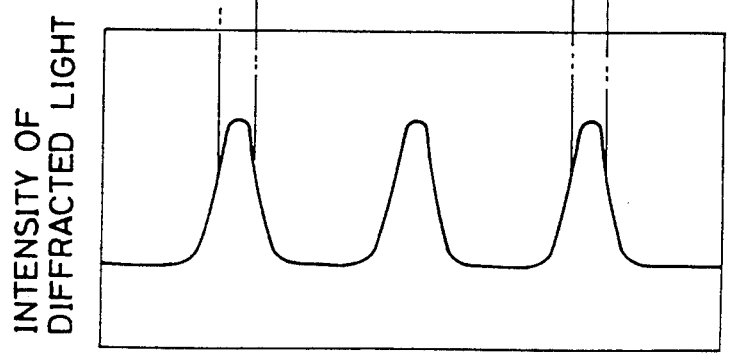
FIG. 7C is a diagram of signal waveform provided by light diffracted from the conventional alignment marks shown in FIGS. 7A and 7B.
Figure 8A:
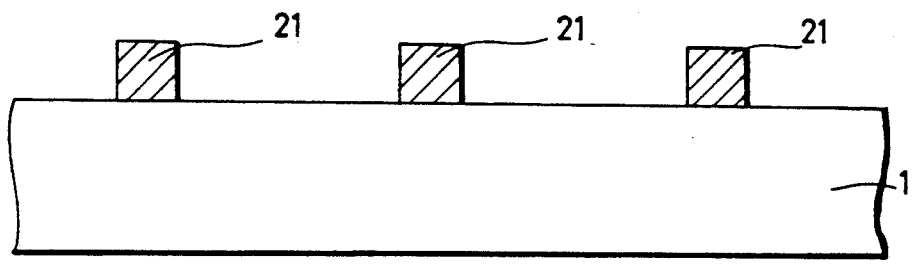
FIGS. 8A to 8C are cross sectional views showing a method of forming the conventional alignment marks shown in FIGS. 7A and 7B.
Figure 8B:
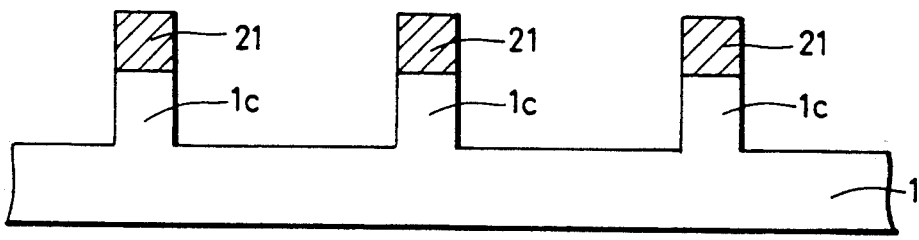
Figure 8C:
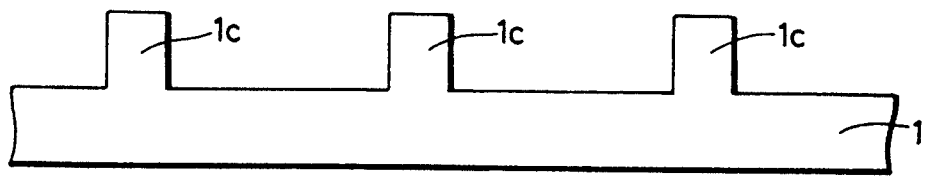
Figure 9A:
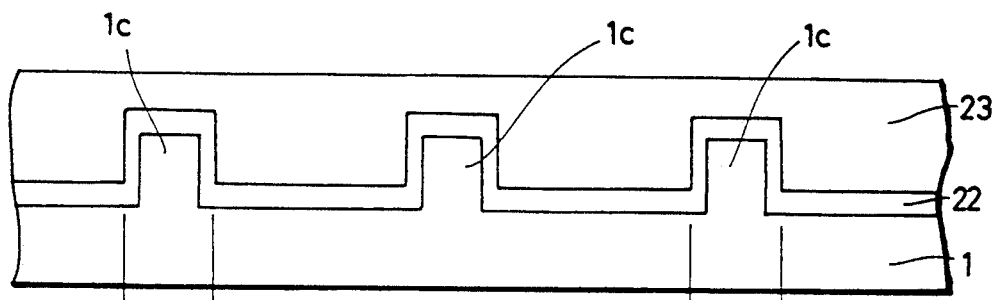
FIG. 9A shows shapes of an ideal upper layer film and a resist film formed on the alignment marks of FIG. 7B.
Figure 9B:
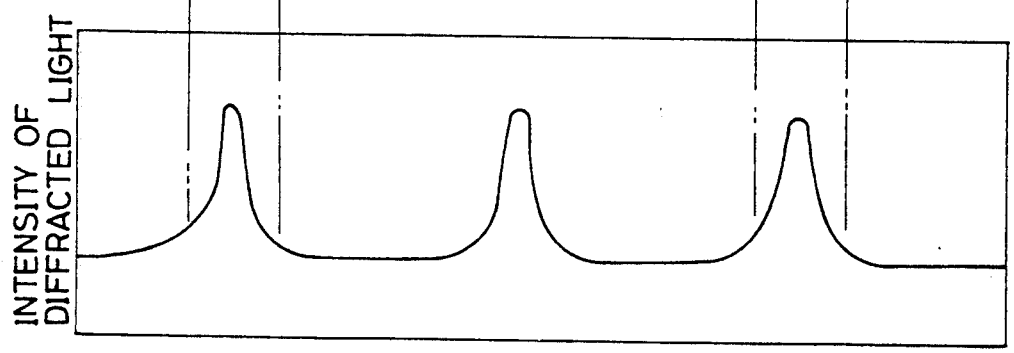
FIG. 9B is a diagram of signal waveform provided by light diffracted from alignment marks shown in FIG. 9A.
Figure 10A:
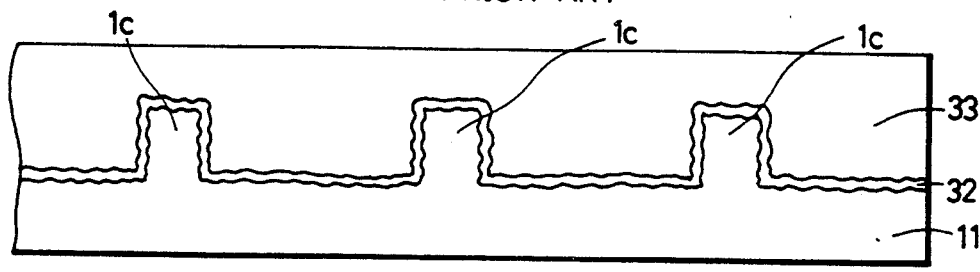
FIG. 10A is a cross sectional view showing shapes of alignment marks when alignment marks are formed on a substrate whose surface is rough.
Figure 10B:
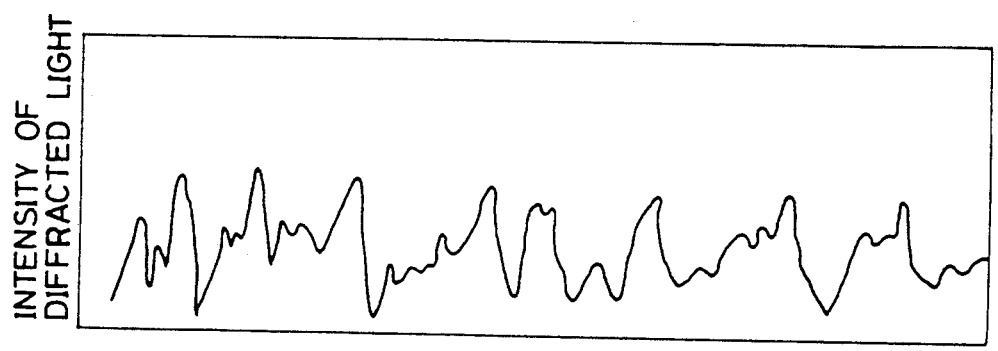
FIG. 10B is a diagram of signal waveforms provided by light diffracted from the alignment marks shown in FIG. 10A.

Embodiments of the present invention will be described in the following with reference to the figures. Referring to FIG. 1A, alignment marks of one embodiment will be described. Flat portions 1a having high surface reflectance and rough portions 1b are formed spaced apart from each other by a prescribed distance on a surface of a substrate 1. When a He-Ne laser beam (not shown) is directed as alignment light to the substrate 1 having such a surface shape, detected signal waveform of diffracted light is as shown in FIG. 1B. More specifically, peaks of waveforms appear at portions corresponding to the flat portions 1a, and waveforms of low level without peaks correspond to other regions, that is, rough portions 1b. Registration of masks can be done in the similar manner as in the prior art, based on the peak positions corresponding to the flat portions 1a. Namely, the flat portions 1a correspond to the conventional alignment marks 1c (see FIG. 7B).

Figure 2A:
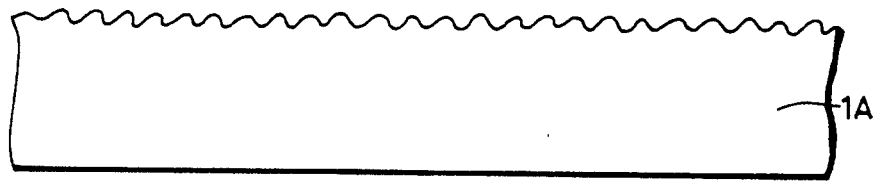
FIGS. 2A and 2B are cross sectional views showing one embodiment of a method of manufacturing alignment marks shown in FIG. 1A.
Figure 2B:
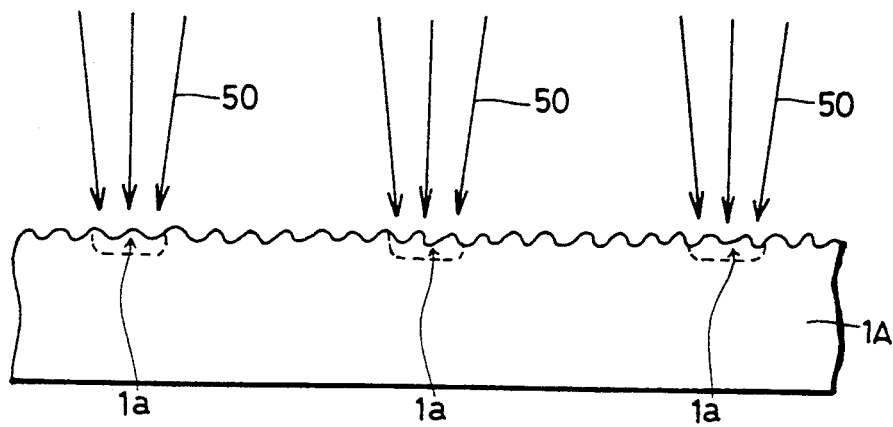

Referring to FIG. 2A, in this embodiment, a method of forming alignment marks of a substrate 1a having rough surface will be described. When the substrate 1a has such a shape as shown in FIG. 2A, a high output laser beam 50 (for example excimer laser beam) or infrared light which can exceed melting point of the substrate 1A is directed to regions which are to be the flat portions 1a, as shown in FIG. 2B. Consequently, regions which are to be the flat portions 1a to which the laser beam 50 is directed are melt and made flat, and vertical reflectance thereof is increased. In this embodiment, flat portions 1a are formed on the substrate 1 by means of a laser beam 50. However, the present invention is not limited thereto. When flat portions 1a for the alignment marks are to be formed at respective layers as needed, when a plurality of layers are formed on the substrate 1, conditions of laser beam irradiation may be adjusted corresponding to the melting points of the respective layers on which the flat portions 1a are to be formed, so that the flat portions 1a can be formed easily.

Figure 3A:
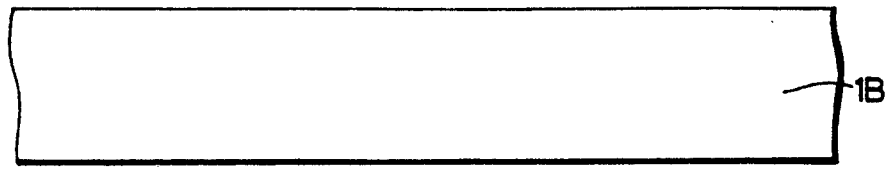
FIGS. 3A and 3B are cross sectional views showing another embodiment of the method of manufacturing alignment marks shown in FIG. 1A.
Figure 3B:
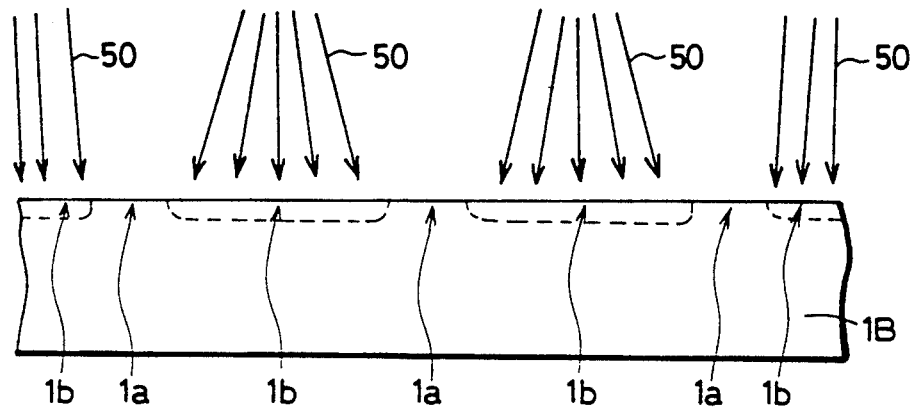

Referring to FIG. 3A, in this embodiment, a method of forming alignment marks on a substrate 1B having a flat surface will be described. First, as shown in FIG. 3B, a laser beam 50 is directed to regions which are to be rough portions 1b. By the irradiation of the laser beam 50, the regions are turned to rough portions 1b. In the case of a substrate 1B having a flat surface, a shape including flat portions 1a and rough portions 1b can be easily formed by directing laser beam 50 to the regions which are to be the rough portions 1b.

Figure 4A:
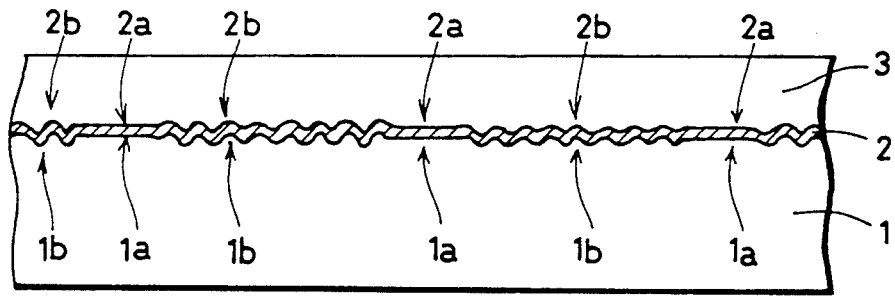
FIG. 4A shows shapes of alignment marks when a metal film is formed by spattering on the alignment marks shown in FIG. 1A.
Figure 4B:
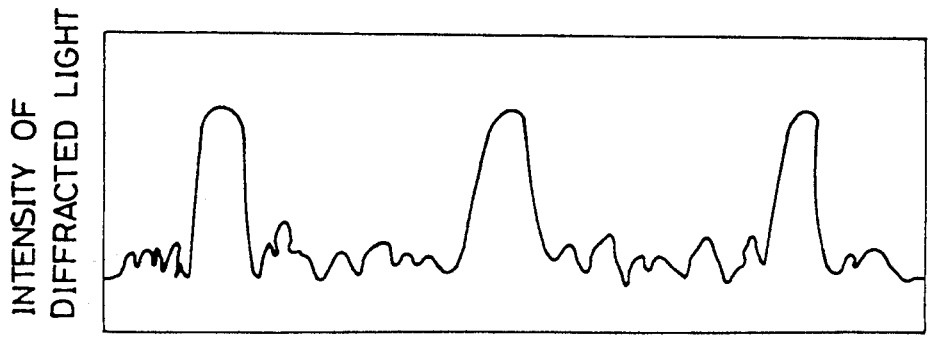
FIG. 4B is a diagram of signal waveforms provided by light diffracted from alignment marks shown in FIG. 4A.
Figure 11A:
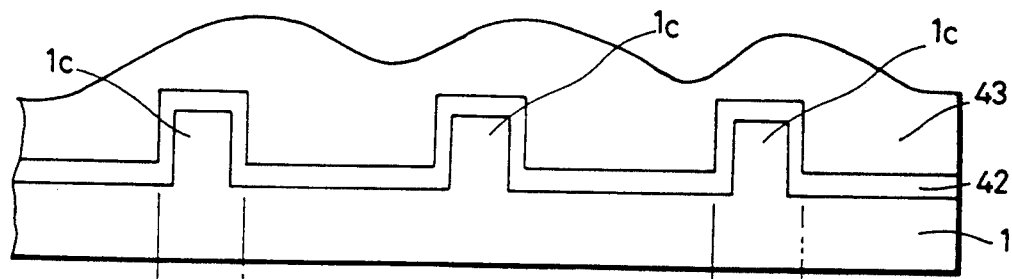
FIG. 11A shows shapes of alignment marks when a normal insulating film and an actual resist film are formed by a method other than spattering on alignment marks of FIG. 7B.
Figure 11B:
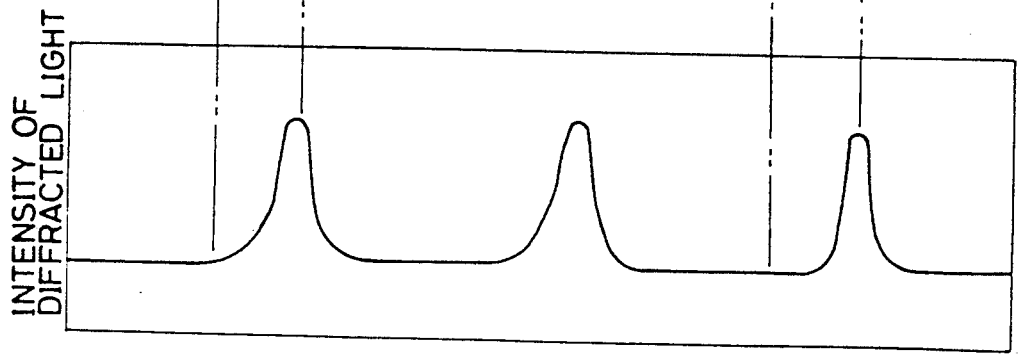
FIG. 11B is a diagram of signal waveform provided by light diffracted from the alignment marks shown in FIG. 11A.

Referring to FIG. 4A, when a metal film 2 is formed by spattering on a substrate 1 having flat portions 1a and rough portions 1b as shown in FIG. 1A, the surface of the metal film 2 has the same shape as the flat and rough portions 1a and 1b. The surface of the metal film 2 includes flat portions 2a and rough portions 2b. However, since the alignment marks are not the conventional concave and convex shaped marks (see FIG. 11A), a resist film 3 can be formed symmetrically and uniformly on the metal film 2. Consequently, the signal waveform of the diffraction light is as shown in FIG. 4B, which eliminates the disadvantages of the prior art, that is, deviation of peak point of the signal waveform derived from asymmetrical coverage of the resist film 3.

Figure 5A:
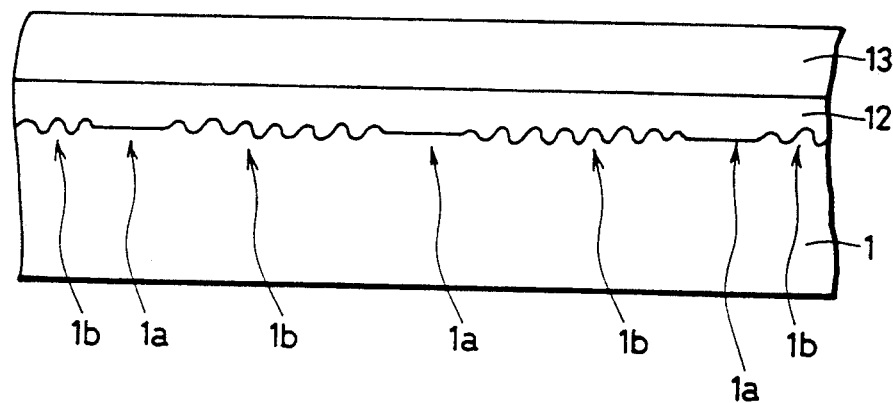
FIG. 5A shows shapes of alignment marks when a normal insulating film or the like is formed not by spattering on alignment marks shown in FIG. 1A.
Figure 5B:
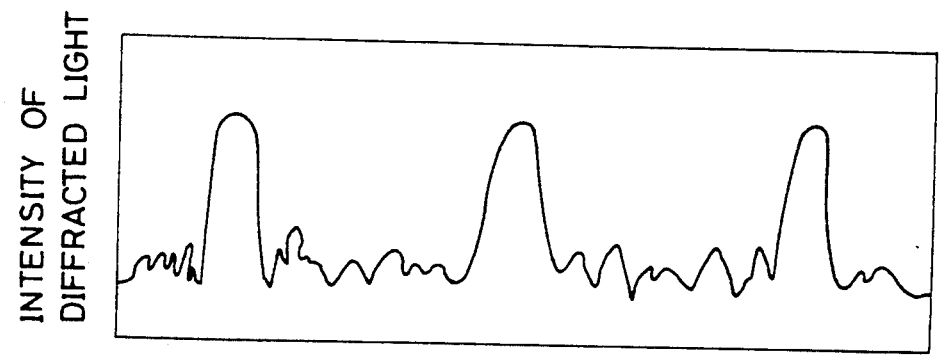
FIG. 5B is a diagram of signal waveform provided by light diffracted from alignment marks shown in FIG. 5A.
Figure 6:
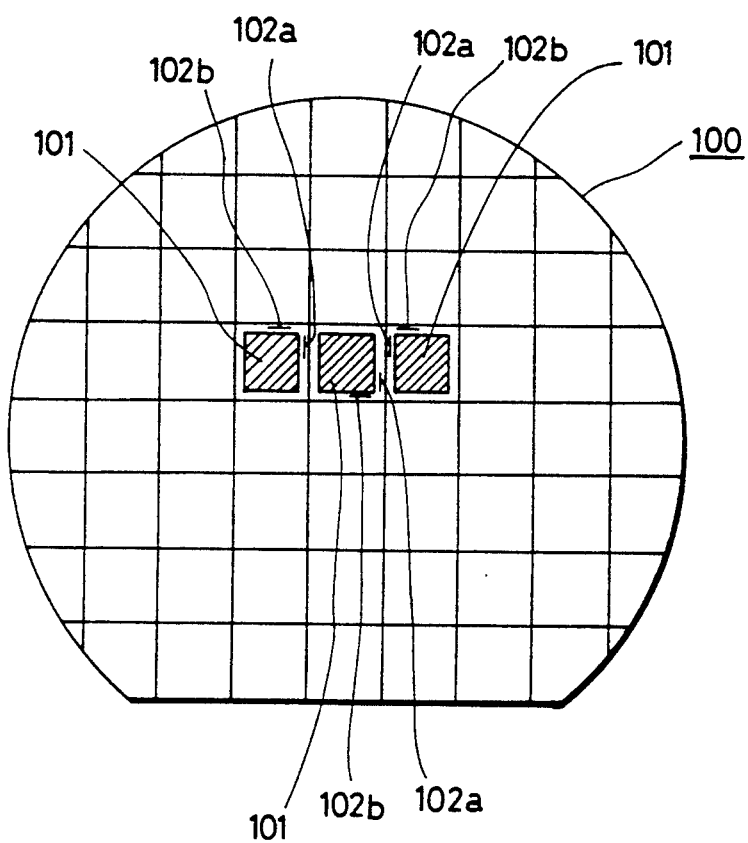
FIG. 6 is a schematic diagram showing the whole structure of a semiconductor wafer on which conventional alignment marks are formed.

Referring to FIG. 5A, in this embodiment, an example is shown in which a normal insulating film 12 is formed, not by spattering, on the substrate 1 having flat portions 1a and rough portions 1b shown in FIG. 1A, and a resist film 13 is formed on the insulating film 12. Different from the embodiment shown in FIG. 4A, when an insulating film 12 or the like is formed on the substrate 1 by a method other than spattering, the surface of the insulating film 12 becomes flat, since the film is thick. In addition, the resist film 13 formed on the insulating film 12 also has a flat surface. The light for alignment passes through such an insulating film 12 which is not a metal film, and therefore a signal waveform of the diffraction light such as shown in FIG. 5B can be provided by the flat and rough portions 1a and 1b formed on the surface of the substrate 1, when alignment light is directed thereto. Thus, registration of masks can be done accurately based on the signal waveform.

As described above, as to the alignment marks shown in FIG. 1A, by forming flat portions 1a having high vertical reflectance serving as the alignment mark portions and rough portions 1b alternately, peak positions of the signal waveform of the diffraction light can be provided by the flat portions 1a, and registration of masks can be done based thereon. When an insulating film 12 and a resist film 13 such as shown in FIG. 5A are formed on the substrate 1 having the rough portions 1b and flat portions 1a serving as the alignment marks, the flat portions 1a and the rough portions 1b do not have the concave and convex shapes as the conventional alignment marks, so that the surface height of the resist film 13 does not become asymmetrical. Therefore, deviation of the peak positions of the signal waveform caused by asymmetrical resist film, which was the problem in the prior art, can be effectively prevented.

In the method of forming alignment marks shown in FIGS. 2A and 2B, when the surface of the substrate 1A is rough, a laser beam 50 is directed to regions which are to be flat portions 1a, so as to melt the surface thereof to provide flat portions 1a having improved vertical reflectance. Therefore, even if the surface is rough, alignment marks capable of providing more accurate registration signals than the prior art can be formed easily, enabling accurate registration of masks.

As described above, for the alignment marks of the present invention, flat regions and rough regions are formed alternately spaced apart from each other by a prescribed distance on at least a surface of a substrate. Consequently, the height of resist surface does not become asymmetrical, when an upper layer film and a resist film are formed on the flat regions and the rough regions, whereby degradation of accuracy in registration due to unevenness of the resist film surface can be effectively prevented.

In a method of forming alignment marks in accordance with the present invention, by directing a high energy beam to at least prescribed regions of a substrate surface, flat regions with flat surfaces and rough regions with rough surfaces are formed. If the substrate surface is rough, flat regions having high surface reflectance can be easily formed by irradiation of high energy beam. Consequently, even if the surface is rough, alignment marks capable of accurate mask registration signals could be easily formed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor comprising:
  a substrate, and
  alignment marks formed at least on a surface of said substrate for registering masks of layers successively formed on said substrate, wherein
  said alignment marks include flat regions and rough regions alternately formed and spaced apart from each other by a prescribed distance, and
  said rough regions have no stepped portions.

2. The semiconductor according to claim 1, wherein
  said flat regions includes a flat region formed by irradiation of prescribed regions on the surface of said substrate with a high energy beam.

3. The semiconductor according to claim 1, wherein said rough regions includes a rough region formed by irradiation of prescribed regions on the surface of said substrate with a high energy beam.

4. The semiconductor according to claim 1, wherein said alignment marks are formed on a surface of a metal film which is formed by spattering.

5. In a semiconductor including a substrate and alignment marks for registrating masks of layers successively formed on said substrate, a method of forming said alignment marks at least on a surface of said substrate comprising the step of:

forming flat regions having flat surfaces and rough regions having rough surfaces with no stepped portions by directing a high energy beam to at least prescribed regions on the surface of said substrate.

6. The method of forming said alignment marks according to claim 5, wherein said step of forming flat regions and rough regions includes the step of forming said flat regions and said rough regions by directing a high energy beam at said prescribed regions and melting said prescribed regions of said substrate by irradiation thereof.

7. The method of forming said alignment marks according to claim 5, wherein said high energy beam is one of either a laser beam and infrared light.

8. The method of forming said alignment marks according to claim 5, wherein when the surface of said substrate is rough said step of forming said flat regions and said rough regions includes the step of forming said flat regions by melting said prescribed regions by irradiation of said high energy beam on the prescribed regions of said substrate.

9. The method of forming said alignment marks according to claim 5, wherein when the surface of said substrate is flat said step of forming said flat regions and said rough regions includes the step of forming said flat regions by melting said prescribed regions by irradiation of said high energy beam on the prescribed regions of said substrate.

* * * * *